(12) United States Patent
Cartina

(10) Patent No.: US 9,973,355 B1
(45) Date of Patent: May 15, 2018

(54) DECISION FEEDBACK EQUALIZER FOR SINGLE-ENDED SIGNALS TO REDUCE INTER-SYMBOL INTERFERENCE

(71) Applicant: INPHI CORPORATION, Santa Clara, CA (US)

(72) Inventor: Dragos Cartina, Burnaby (CA)

(73) Assignee: INPHI CORPORATION, Santa Clara, CA (US)

( * ) Notice: Subject to any disclaimer, the term of this patent is extended or adjusted under 35 U.S.C. 154(b) by 6 days.

(21) Appl. No.: 15/133,609

(22) Filed: Apr. 20, 2016

(51) Int. Cl.
| | |
|---|---|
| *H03H 7/30* | (2006.01) |
| *H04L 25/03* | (2006.01) |
| *G11C 19/28* | (2006.01) |
| *H03K 3/356* | (2006.01) |

(52) U.S. Cl.
CPC ........ *H04L 25/03057* (2013.01); *G11C 19/28* (2013.01); *H03K 3/356113* (2013.01)

(58) Field of Classification Search
None
See application file for complete search history.

(56) References Cited

U.S. PATENT DOCUMENTS

| | | | |
|---|---|---|---|
| 8,330,537 B1* | 12/2012 | Ghorpade | H03F 1/0277 330/136 |
| 9,705,475 B2* | 7/2017 | Dedic | H03H 11/22 |
| 2014/0035650 A1* | 2/2014 | Zerbe | H03L 7/06 327/299 |
| 2016/0013955 A1* | 1/2016 | Dong | H04L 25/03019 375/317 |
| 2017/0019275 A1* | 1/2017 | Norimatsu | H04L 25/03 |

* cited by examiner

*Primary Examiner* — Harry W Byrne
*Assistant Examiner* — Sultana Begum
(74) *Attorney, Agent, or Firm* — Richard T. Ogawa; Ogawa P.C.

(57) ABSTRACT

The present invention is directed to communication systems and methods thereof. More specifically, an embodiment of the present invention includes a buffer that is coupled to a reference terminal. A shift register stores decision levels for post-cursor positions. A plurality of switches converts the decision levels to equalization currents during an equalization process. The equalization currents are converted to equalization voltage terms by one or more load resistors. The buffer is provided between the reference terminal and the one or more load resistors. There are other embodiments as well.

10 Claims, 10 Drawing Sheets

DECISION FEEDBACK EQUALIZER FOR SINGLE-ENDED SIGNALS TO REDUCE INTER-SYMBOL INTERFERENCE

CROSS-REFERENCES TO RELATED APPLICATIONS

Not Applicable

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to communication systems and methods thereof.

Over the past few decades, computer processors have become faster and faster, loosely following Moore's law, which states that the number of transistors in a densely integrated circuit has doubled approximately every two years. As processors become faster in processing data, data buses that connect processors to other components (e.g., memory, I/O, graphics) of computer systems need to provide high-speed and large bandwidth communication links. Physical distance between a central processing unit (CPU) and the DRAM is often very short and often measured in centimeters, but the amount of data transfers between the two entities can be large over a short amount of time. For example, when CPU operating at 2 GHz with multiple cores, a large amount of data is often moved between CPU and DRAM through a memory bus at a high speed (measured in Gbps). Typically, parallel communication protocols are used for this type of high-speed data communication. Unfortunately, performance and data rate are limited by, among other things, channel loss and intersymbol interference (ISI), which are characteristics of the communication channel. Decision feedback equalizer (DFE), which is usually implemented at the receiver, is often used to improve performance of data communication by reducing or eliminating the effects of channel loss and ISI.

Over the past, there have been various conventional DFE implementations for reducing or removing inter-symbol interference. Unfortunately, they have been inadequate for various reasons. Therefore, improved systems and methods are desired.

BRIEF SUMMARY OF THE INVENTION

The present invention is directed to communication systems and methods thereof. More specifically, an embodiment of the present invention includes a buffer that is coupled to a reference terminal. A shift register stores decision levels for post-cursor positions. A plurality of switches converts the decision levels to equalization currents during an equalization process. The equalization currents are converted to equalization voltage terms by one or more load resistors. The buffer is provided between the reference terminal and the one or more load resistors. There are other embodiments as well.

According to an embodiment, the present invention provides a DFE system that includes an input terminal for receiving an input voltage. The system also includes a reference terminal for receiving a reference voltage. The system additionally includes a buffer module connected to the reference terminal via a buffer input. The system further includes a first drop resistor coupled to the buffer module via a buffer output. The system also includes a shift register comprising n flip-flops for storing equalization decision levels. The system also includes a switching module comprising n switches electrically coupled to the n flip-flops. The n switches include a first switch, which has a pair of current sources. The switching module is configured to provide equalization voltage by generating equalization current using decision levels stored at the shift register to the first drop resistor.

According to another embodiment, the present invention provides a DFE system that has an input terminal for receiving an input voltage. The system also includes a reference terminal for receiving a reference voltage. The system additionally includes a buffer module connected to the reference terminal via a buffer input. The system also includes a first drop resistor coupled to the buffer module via a buffer output. The system additionally includes a second drop resistor coupled to the buffer output and the first drop resistor. The system further includes a shift register comprising n flip-flops for storing decision levels. The system also includes a switching module comprising n switches electrically coupled to the n flip-flops. The n switches include a first switch. The first switch has a pair of current sources and a pair of matching NMOS transistors. The first drop resistor is directly coupled to a first NMOS transistor of the matching NMOS transistors. The second drop resistor is directly coupled to a second NMOS transistor of the matching NMOS transistors. The switching module is configured to provide equalization voltage by generating equalization current using decision levels stored at the shift register to the first drop resistor.

According to yet another embodiment, the present invention provides a DFE system that includes an input terminal for receiving an input voltage. The system includes a reference terminal for receiving a reference voltage. The system also includes a feedback module comprising a feedback input and a first feedback output and a second feedback output. The feedback input is coupled to the reference terminal. The system also includes a buffer module connected to the reference terminal via the feedback module. The system also includes a first drop resistor coupled to the buffer module via a buffer output of the buffer module. The system also includes a second drop resistor coupled to the buffer module via the buffer output. The system includes a shift register that has n flip-flops for storing decision levels. The shift register is coupled to the first drop resistor. The system also includes a switching module comprising n switches electrically coupled to the n flip-flops. The n switches include a first switch that has a first current source and a first pair of MOS devices. The first pair of MOS devices comprises a first MOS device and a second MOS device. The first MOS device is coupled to the first drop resistor. The second MOS device is coupled to the second drop resistor. The switching module is configured to provide equalization voltage by generating equalization current using decision levels stored at the shift register to the first drop resistor.

It is to be appreciated that embodiments of the present invention provide many advantages over conventional techniques. Among other things, DFE systems according to embodiments of the present invention, in comparison to existing systems, provide improved linearity and bandwidth, reduce propagation delay, offer better DFE tap accuracy, expand input common-mode range. Additionally, embodiments of the present invention can be implemented in conjunction with existing systems and processes. For example, existing manufacturing processes can be used to fabricate the DFE systems described herein. In addition, the DFE system can be implemented in conjunction with existing communication systems. There are other benefits as well, as explained in the present disclosure.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention is directed to communication systems and methods thereof. More specifically, an embodiment of the present invention includes a buffer that is coupled to a reference terminal. A shift register stores decision levels for post-cursor positions. A plurality of switches converts the decision levels to equalization currents during an equalization process. The equalization currents are converted to equalization voltage terms by one or more load resistors. The buffer is provided between the reference terminal and the one or more load resistors. There are other embodiments as well.

Figure 1:
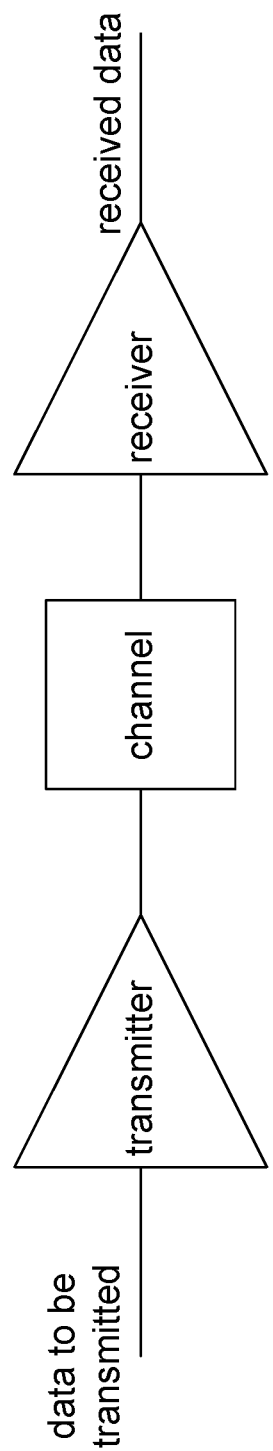
FIG. 1 is a simplified diagram illustrating a communication system.

In a communication system, data is transmitted from a transmitter to a receiver through a communication channel. FIG. 1 is a simplified diagram illustrating a communication system. For example, data is processed by the transmitter to a proper format for transmission through the communication channel. Depending on the communication channel and transmission characteristics, data may be compressed, encoded, and/or modulated for transmission. In high-speed communication systems, data is encoded into symbols for efficient transmission. High-speed communication channels, such as the one shown in FIG. 1, are negatively affected by inter-symbol interference (ISI). Usually, ISI can be attributed to channel losses and channel discontinuities. For example, channel losses are often associated with conductor loss and/or dielectric loss, and channel discontinuities usually occur when the characteristic impedance of the channel changes (e.g. at connectors or contact vias).

Figure 2:
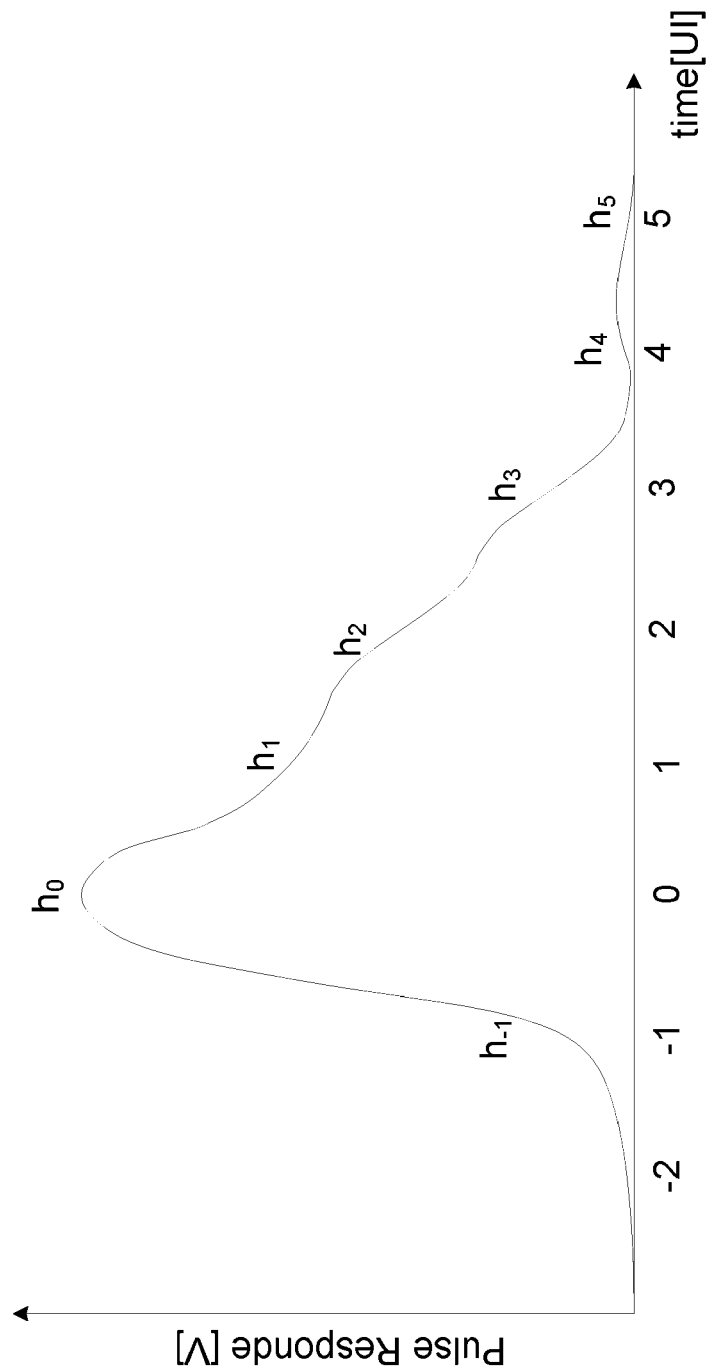
FIG. 2 is a simplified graph illustrating a raw channel pulse response.

As a result of the ISI, channel pulse responses as received by the receiver deviate from an ideal pulse response waveform. FIG. 2 is a simplified graph illustrating a raw channel pulse response. As can be seen in FIG. 2, ISI contributes to energy outside the pulse response cursor position at $h_0$. More specifically, there is energy at both pre-cursor position ($h_{-1}$) and post-cursor positions ($h_1$, $h_2$, $h_3$, etc.). The extra energy at pre-cursor and post-cursor positions (e.g., positions outside $h_0$) leads to poor signal, as the receiver needs to determine whether the energy at these locations represents additional symbols or simply ISI. To address the ISI problem, decision feedback equalizer (DFE) is often used. For example, to remove post-cursor ISI, a decision feedback equalizer (DFE) subtracts ISI from previous symbols (i.e. post-cursors) from the incoming signal through a feedback filter.

Figure 3:
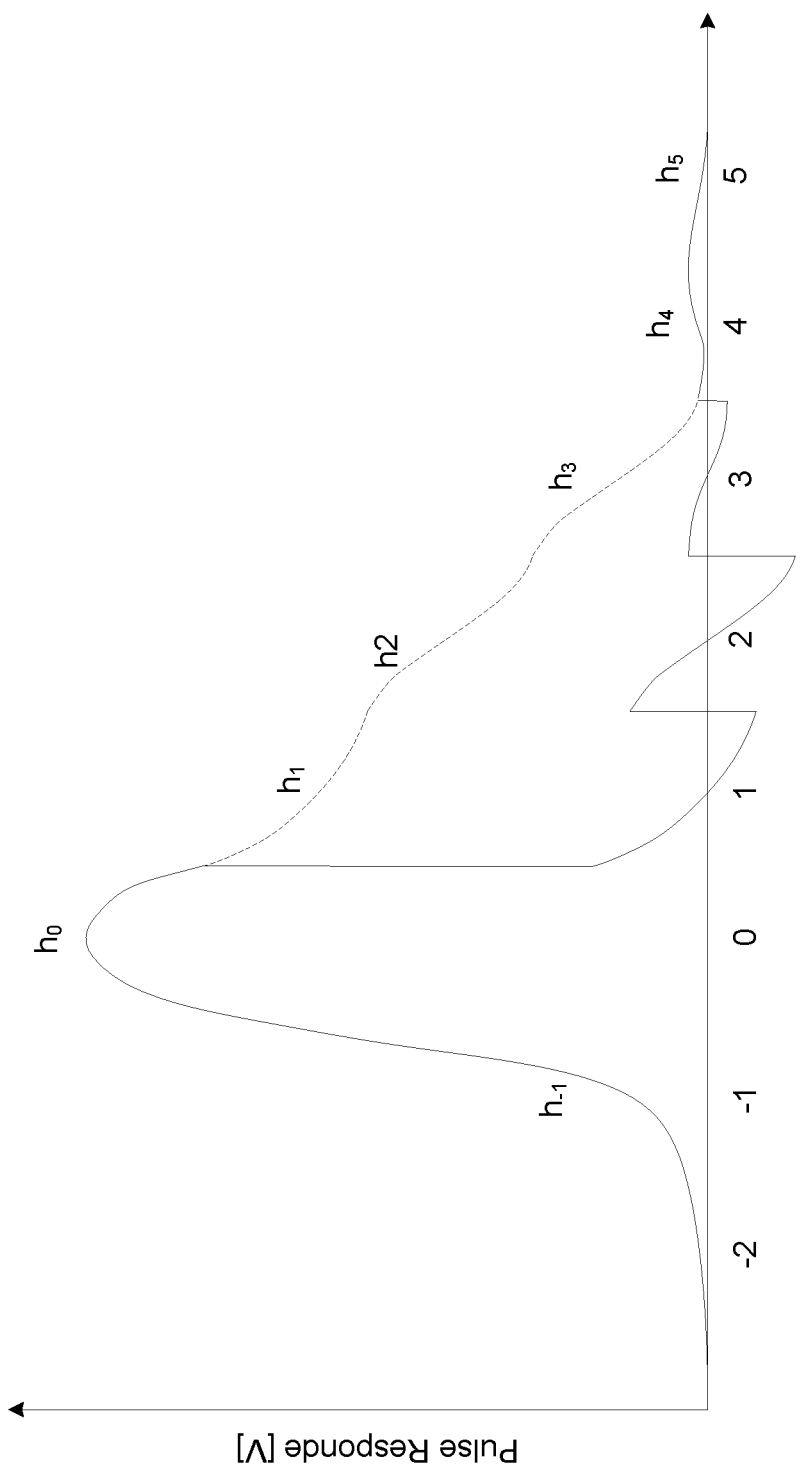
FIG. 3 is a simplified diagram illustrating removing ISI using DFE.

FIG. 3 is a simplified diagram illustrating removing ISI using a DFE. As can be seen in FIG. 3, most of the energy at post-cursor positions are reduced to a very low level, and the channel pulse response is mostly at $h_0$ after the DFE removed the post-cursor positions.

Figure 4:
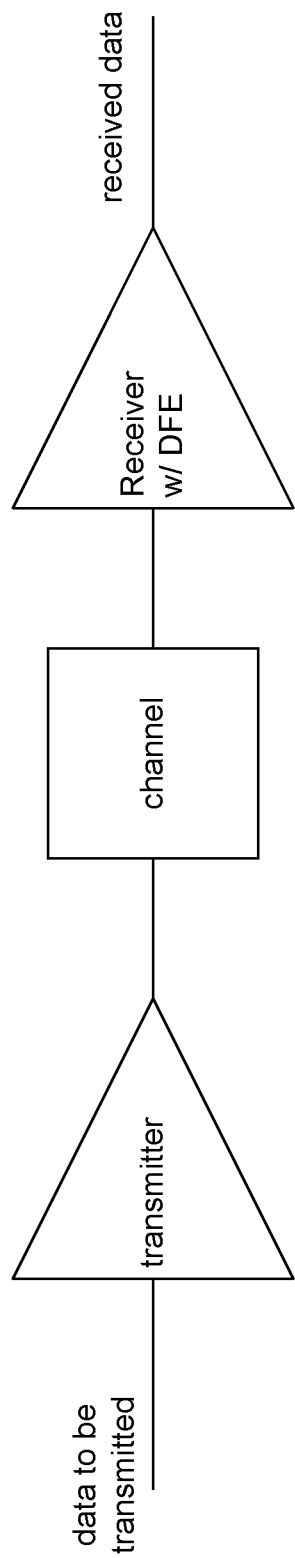
FIG. 4 is a simplified diagram illustrating a communication system with DFE.

Decision feedback equalizers are typically implemented at the receiver side. FIG. 4 is a simplified diagram illustrating a communication system with DFE. As shown in FIG. 4, DFE is implemented at the receiver end of the communication system. For example, the DFE stores ISI information associated with incoming signal transmitted through the communication channel and subtracts the stored ISI from the subsequent signals. It is to be appreciated that the DFE can be used in high-speed communication applications. For example, the communication system can be a memory bus that provides a communication channel between a process and a memory module (e.g., DRAM).

Figure 5:
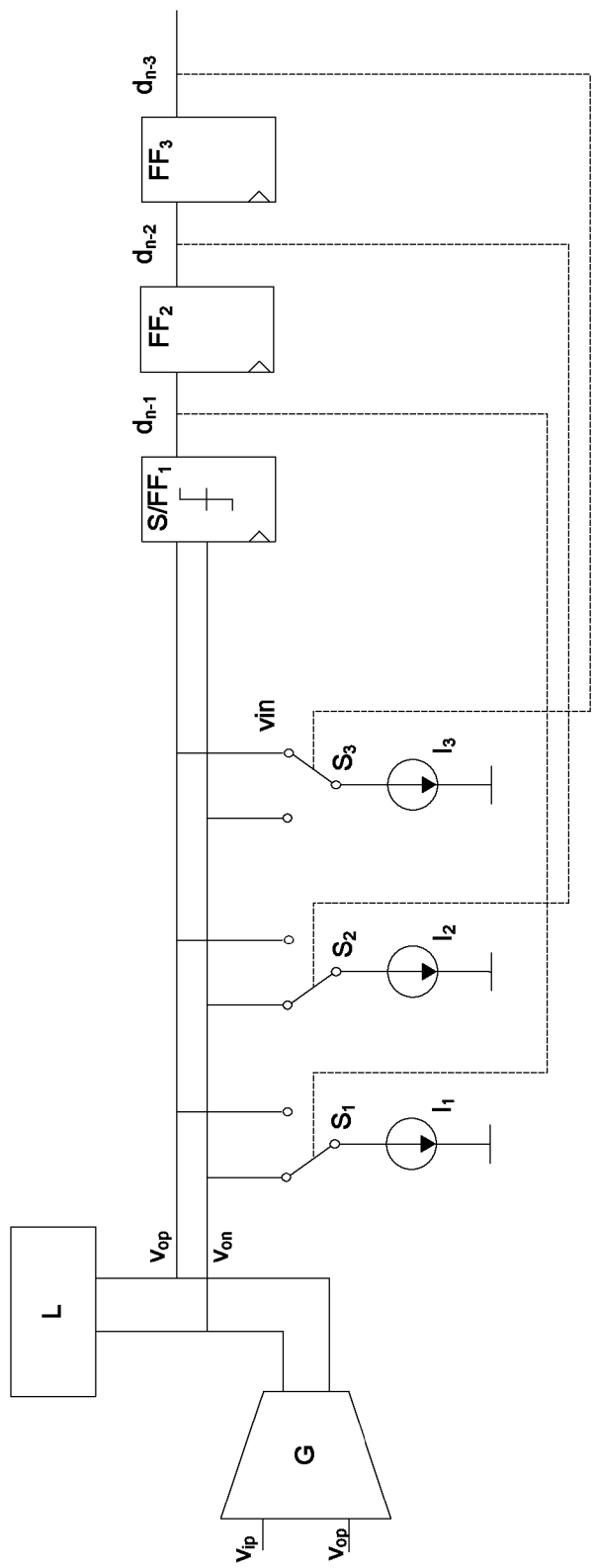
FIG. 5 is a simplified diagram illustrating a conventional DFE implementation for differential signals.

FIG. 5 is a simplified diagram illustrating a conventional DFE implementation for differential signals. In such an implementation, the differential inputs $v_{ip}$ and $v_{in}$ are applied to a transconductance (G) element that drives a load (L). The differential outputs $v_{op}$ and $v_{on}$ are applied to a differential sampler/flip-flop (S/FF$_1$) followed by additional flip-flops (two more here, FF$_2$ and FF$_3$). The three flip-flops respectively drive three switches $S_1$, $S_2$, and $S_3$ which direct three currents $I_1$, $I_2$, and $I_3$ into the outputs $v_{op}$ and $v_{on}$ of the transconductance. The three currents $I_1$, $I_2$, and $I_3$ are calculated such that the voltage drops they introduce in the load (L) cancel the post-cursors $h_1$, $h_2$, and $h_3$ when referred back to the inputs $v_{ip}$ and $v_{in}$ of the transconductance (G). It is to be appreciated that while the implementation shown in FIG. 3 has three DFE taps, similar structures can be implemented with different number of DFE taps.

Figure 6:
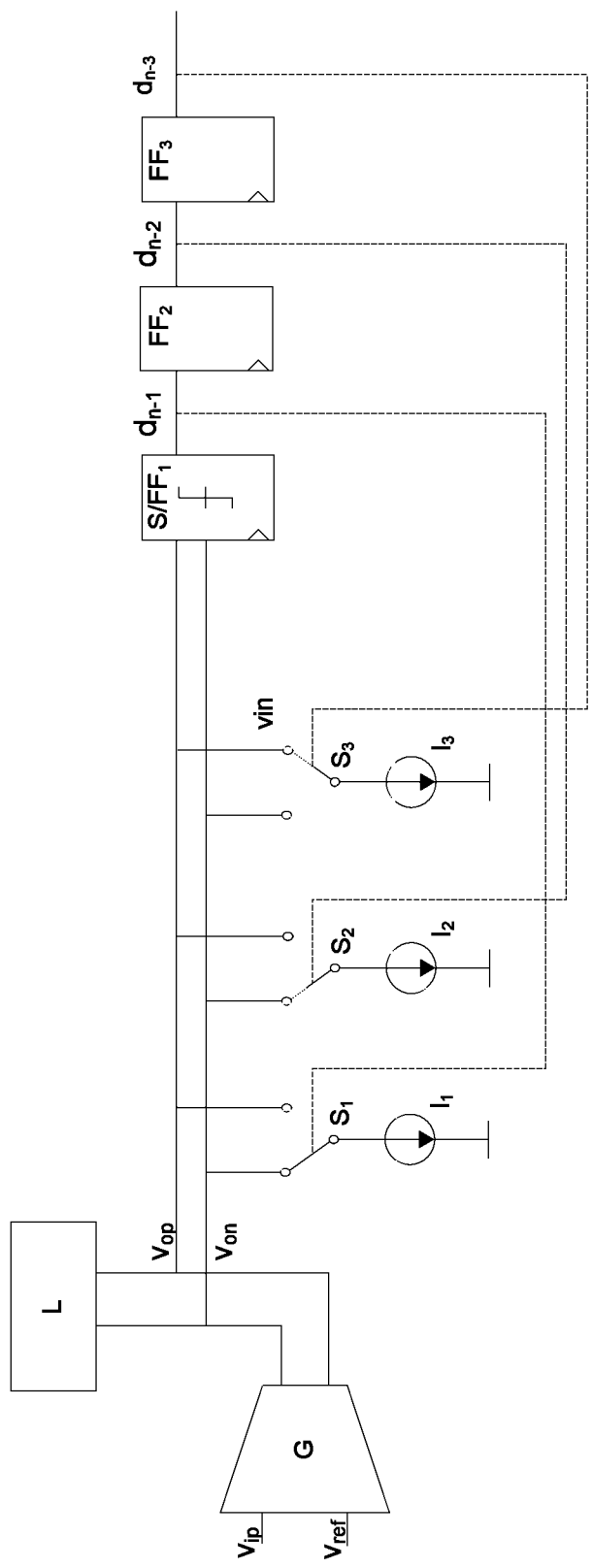
FIG. 6 is a simplified diagram illustrating a conventional DFE implementation with a reference voltage.

FIG. 6 is a simplified diagram illustrating a conventional DFE implementation with a reference voltage. For example, the implementation in FIG. 6 can be used in single-ended applications as well, where one of the inputs (e.g., $v_{in}$ in FIG. 5) is replaced with a reference voltage ($v_{ref}$). In both differential and single-ended implementations, the role of the transconductance (G) element is to convert the input voltage into a pair of differential currents into the load (L). Since feedback currents $I_1$, $I_2$, and $I_3$ are directed by flip-flop decisions $d_{n-1}$, $d_{n-2}$, and $d_{n-3}$ into the same load (L), it follows that this structure performs the summation (or subtraction) of feedback currents from the differential output currents of the transconductance (G).

Figure 7:
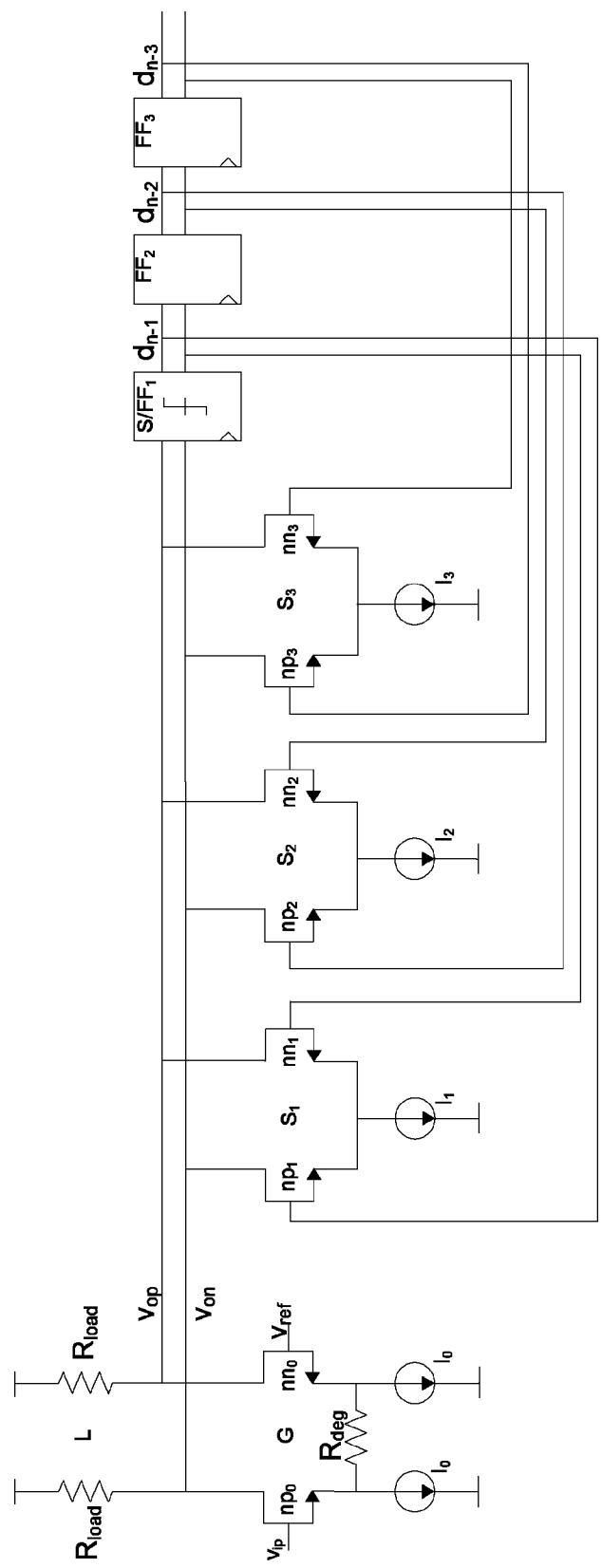
FIG. 7 is a simplified diagram illustrating a conventional DFE implementation at a circuit level.

FIG. 7 is a simplified diagram illustrating a conventional DFE implementation at a circuit level. In this implementation the transconductance (G) is implemented with a differential pair (NMOS devices $np_0$ and $nn_0$), degeneration resistance ($R_{deg}$), and current sources ($I_0$). The load (L) is implemented with load resistors ($R_{load}$). As an example, in other single-ended implementations, switched-capacitors can be used instead resistors as the load (L). For example, the switches $S_1$, $S_2$, and $S_3$ are implemented with differential pairs $np_1/nn_1$, $np_2/nn_2$, and $np_3/nn_3$, and current sources $I_1$, $I_2$ and $I_3$.

Unfortunately, conventional DFEs as described above are often inadequate. A majority of high-speed single-ended DFEs, such as DFEs illustrated in FIGS. 5-7, use such current summation for feedback. A commonly used element is transconductance, and the presence of the transconductance required for current summation has a number of drawbacks. Among other things, transconductance elements contribute to DFE nonlinearity. Decision feedback equalizers, by definition, require linear operation from the inputs to the summation points (e.g., $v_{op}$ and $v_{on}$). However, the transconductance elements, as an intrinsic characteristic, always have some sort of nonlinearity. Quite often a transconductance requires gain control and/or feedback to ensure that the nonlinearity is low enough and does not affect DFE performance, which adds complexity to the design.

In addition, the use of transconductances limits the bandwidth, as the bandwidth of the transconductance (G) and load (L) elements are usually lower than that of the DFE sampler. As a result, the signal is often further attenuated at high frequencies even before equalization. Transconductance and load elements additionally may introduce a finite propagation delay into the communication channel, which adds to the total receive propagation delay and latency. In some applications, even small increases in propagation delay are undesirable. Furthermore, the use of transconductances can negatively affect DFE tap accuracy. In some applications, the DFE taps are defined at the input (e.g., $v_{ip}/v_{in}$ or $v_{ip}/v_{ref}$) and have tight tolerances (e.g., ±10%), but a typical transconductance (G) and load (L) set is generally not accurate to this level. Since the taps are applied at the outputs $v_{op}$ and $v_{on}$, when referred back to the input(s), they are scaled by the variable gain of the transconductance into the load and therefore cannot provide high accuracy.

Transconductances in the DFE implementation may limit the input common-mode range. Often transconductances are implemented with differential pairs, which are limited on the low side by the input devices (e.g., $np_0$ and $nn_0$ in FIG. 7), and the current sources ($I_0$ in FIG. 7) not having enough headroom when $v_{ref}$ is low. The degeneration often involved to linearize such DFEs makes the headroom worse, because it increases the voltage excursions at the sources of the input devices (e.g., especially $np_0$ in FIG. 7). Another drawback of having transconductance elements in DFE implementations is that transconductance elements often add to the input referred offset of the receiver. In some cases, the offset of the transconductance can be a function of $v_{ref}$, which makes it harder to compensate.

It is thus to be appreciated that embodiments of the present invention provide DFE implementations that do not rely on transconductance elements, thereby eliminating the drawbacks the conventional DFE implementations. Various DFE embodiments according to the present invention are described in detail below.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

As mentioned above, embodiments of the present invention provide DFE implementations for single-ended signals without transconductance elements. It is to be appreciated, as explained above, DFE implementations according to the present invention, in comparison to existing implementations, provide improved linearity, bandwidth, DFE tap accuracy, input common mode range, offsets, and reduced propagation delay.

Transconductance elements are typically used to convert the input signal from voltage to differential currents for performing summation with the feedback terms in the current domain. To avoid the use of transconductance elements, DFE implementations according to the present invention perform summation directly in the voltage domain. In other words, the summation is applied directly to the inputs $v_{ip}$ and $v_{ref}$. One of the challenges is that the $v_{ip}$ signal is a high-speed signal and the voltage feedback terms cannot be easily added to it. According to various embodiments, the DFE implementations perform summation only on the $v_{ref}$ side, which is usually a DC path. The DFE implementations according to the present invention are be able to add or subtract voltage terms to the $v_{ref}$ input to cancel the post-cursors (e.g., $h_1$, $h_2$, and $h_3$), and these voltage terms are controlled by the decisions of flip-flops (e.g., $FF_1$, $FF_2$ and $FF_3$).

Figure 8:
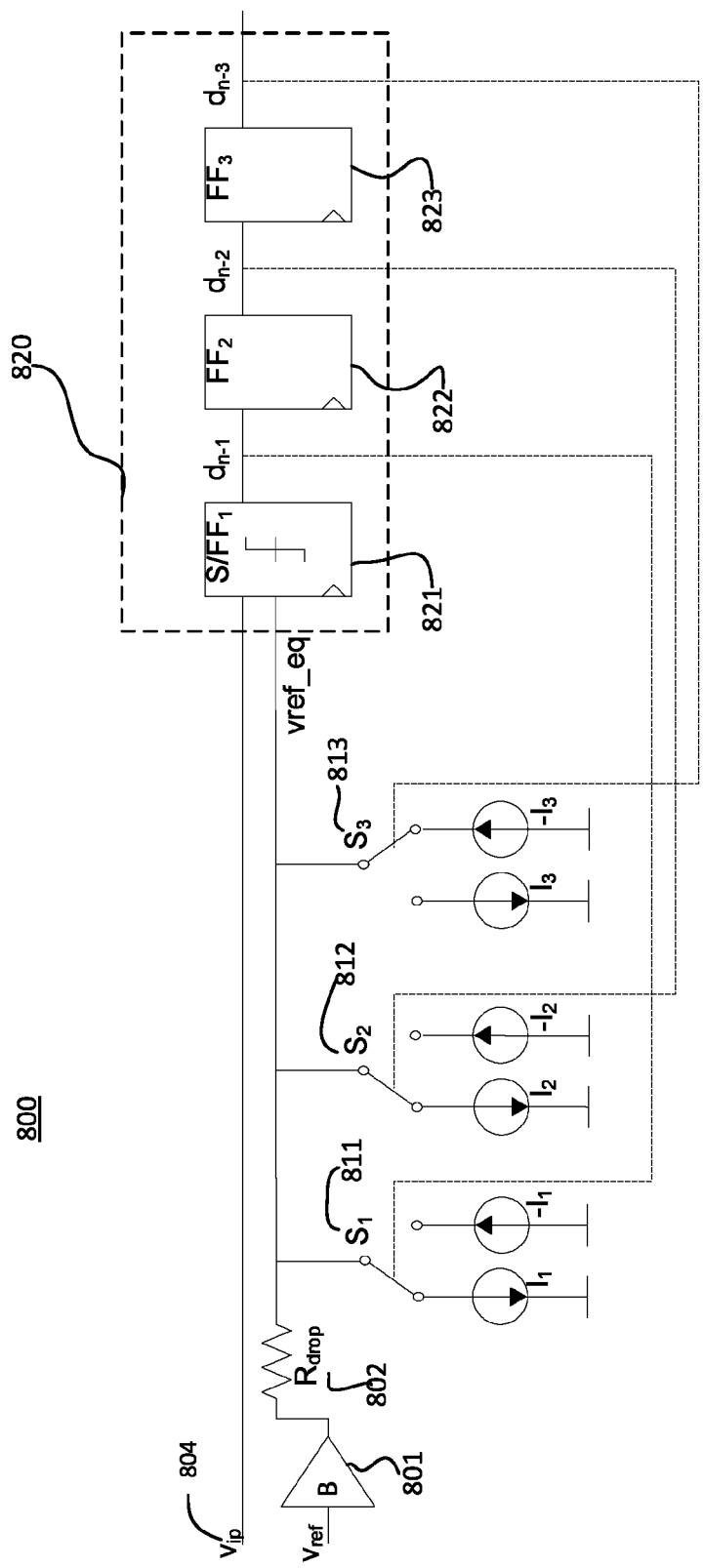
FIG. 8 is a simplified diagram illustrating a DFE system 800 according to an embodiment of the present invention.

FIG. 8 is a simplified diagram illustrating a DFE system 800 according to an embodiment of the present invention. This diagram is merely an example, which should not unduly limit the scope of the claims. One of ordinary skill in the art would recognize many variations, alternatives, and modifications. As an example, DFE system 800 may be implemented as part of a receiver entity (e.g., as shown in FIG. 4). Resistor $R_{drop}$ 802 is provided to create the voltage terms needed. More specifically, resistor 802 is attached to a buffer 801, which is connected to voltage $v_{ref}$ as shown. Currents from the switches 811, 812, and 813 go into resistor 802 to create the required voltage terms for equalization. More specifically, feedback terms are applied as currents into a resistor (or resistors). It is to be noted that an important aspect of this DFE system 800 is that no transconductance element is used. In conventional DFE systems, the current terms for equalization are applied at the output of a transconductance. In contrast, equalization voltage terms are applied directly at one of the inputs of the receiver (i.e., low-speed reference input $v_{ref}$) according to embodiments of the present invention. By applying the equalization voltage terms directly, the transconductance element is not needed at the DFE system 800.

To apply DFE equalization without transconductance elements, the $v_{ref}$ terminal at the input side includes a buffer 801. Among other things, $v_{ref}$ terminal is a sensitive net, which cannot be heavily loaded, and the buffer 801 therefore provides a buffer between $v_{ref}$ and the equalization voltage terms. In addition, the input $v_{ref}$ may be implemented as a shared reference net, and coupling from one receiver to another via $v_{ref}$ is generally to be avoided. The output of the buffer 801 is coupled to the resistor 802. The voltage terms are provided by the shift register 820, which stores post-cursor decision levels. More specifically, the shift register 820 stores past decision levels at positions outside the cursor position (e.g., $h_0$ in FIG. 2). For example, the three flip flops 821, 822, and 823 of the equalization block 820 are specifically configured to store three decision levels corresponding to three post-cursor positions (e.g., $h_1$, $h_2$, $h_3$ in FIG. 2). Depending on the implementations, a different number of flip-flops may be used to store different number of post-cursor positions. Flip-flops of the shift register 820 function as memory units that store post-cursor decisions from the signal. As can be seen in FIG. 2, energy levels at post-cursor positions are not equal, and they are most prominent near the pulse response cursor position $h_0$. For example, the energy level at post cursor position $h_1$ is much higher than the energy level at post cursor position $h_5$, which means that while the energy level at position $h_5$ is undesirable, its effects for many applications may be minimal or negligible. Often, removing undesired energy at three post-cursor positions can be an optimal amount, but in certain applications, a larger number of post-cursors are removed to provide improved performance. For example, for each of the post-cursor position, a corresponding flip-flip (or equivalent) is used to store the decision level.

The shift register 820 is coupled to the switches 811, 812, and 813. As shown, flip-flop 821 is coupled to the switch 811, which can be implemented as two current sources $I_1$ and $I_{-1}$. Similarly, flip-flips 822 and 823 are respectively coupled to switches 812 and 813. The number of switches corresponds to the number to flip-flops, as each of the switches generates a current from the charge stored at the corresponding flip-flop. The currents associated with decision levels of previous post-cursor positions, with $R_{drop}$ 802, become voltage terms for compensating current ISI decision levels.

It is to be appreciated that DFE system 800 provides many advantages over existing implementations. Among other things, DFE system 800 provides improved linearity compared to existing systems. Since the high-speed input is applied directly to the sampler, there is no nonlinearity penalty in the path. Also, since the high-speed input is applied directly to the sampler, there is no bandwidth limitation in the path. By removing extra elements in the data path and having the high-speed input applied directly to the sampler, the additional propagation delay required by the DFE is zero. As shown in FIG. 8, the DFE taps are applied as currents from block 820 into resistors (e.g., resistor 802) directly at one of the inputs without going through a transconductance element. As such there is no concern about the variability of the transconductance gain. DFE system 800 also provides better input common-mode range compared to conventional systems. Among other things, the DFE system 800 does not require the usual degenerated NMOS differential pair, and thus the common-mode range can be significantly larger. For instance, if the sampler has both NMOS and PMOS inputs, the common-mode range can be in principle from rail to rail. In practice, the common-mode range is typically limited by the switches $S_1$, $S_2$, and $S_3$ and the current sources $I_1$, $I_2$, and $I_3$. These can be designed to have a wider range than a degenerated differential pair. Also, assuming the currents $I_1$, $I_2$, and $I_3$ are commutated accurately, there are no additional offsets in this architecture except that introduced by the $v_{ref}$ buffer (B) 801, which is configured to have negligible offset. For example, buffers for low-speed signals are readily available at low power cost (e.g. chopping amplifiers).

Figure 9:
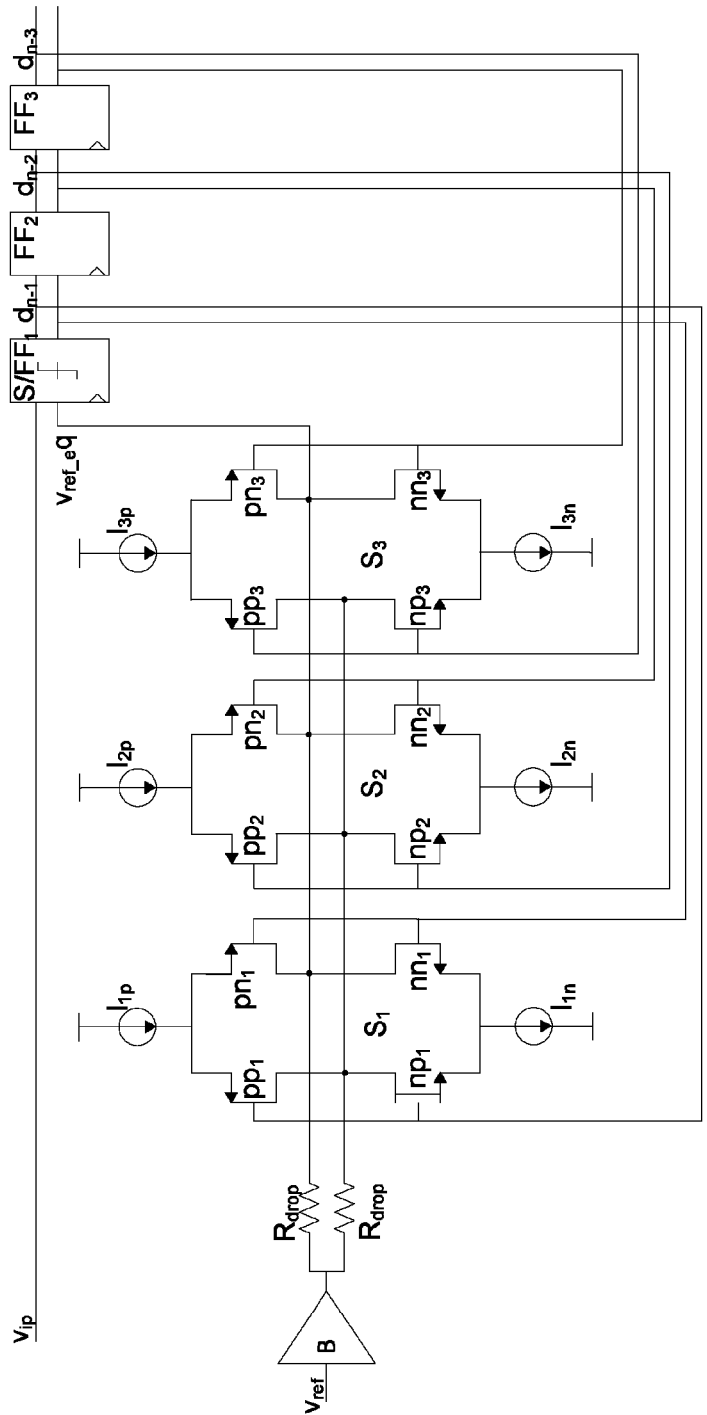
FIG. 9 is a simplified diagram illustrating a DFE system 900 with matching PMOS and NOMS current sources.

On the circuit level, the architecture of DFE system 800 can be implemented in various ways. FIG. 9 is a simplified diagram illustrating a DFE system 900 with matching PMOS and NOMS current sources according to an embodiment of the present invention. This diagram is merely an example, which should not unduly limit the scope of the claims. One of ordinary skill in the art would recognize many variations, alternatives, and modifications. As shown in FIG. 9, DFE system 900 is implemented with matching PMOS and NMOS current source $I_{2p}/I_{2n}$, and $I_{3p}/I_{3n}$) and differential pairs ($nn_1/np_1/pn_1/pp_1$, $nn_2/np_2/pn_2/p_2$, and $nn_3/np_3/pn_3/pp_3$). The currents are commutated into one of the two $R_{drop}$ resistors attached to the buffer (B) output, thereby creating IR voltages that can be used to cancel ISI post-cursors energy. For example, one of the two $R_{drop}$ resistors is connected to the $v_{ref\_eq}$ sampler input while the other is left floating. According to a specific implementation, a DFE system comprises a structure where the PMOS and NMOS currents are only turned on when needed to create IR voltages for $v_{ref\_eq}$, which could save power. A consideration of on-demand on current is that such a structure can be slower and may not be fast enough for high-speed implementations.

Figure 10:
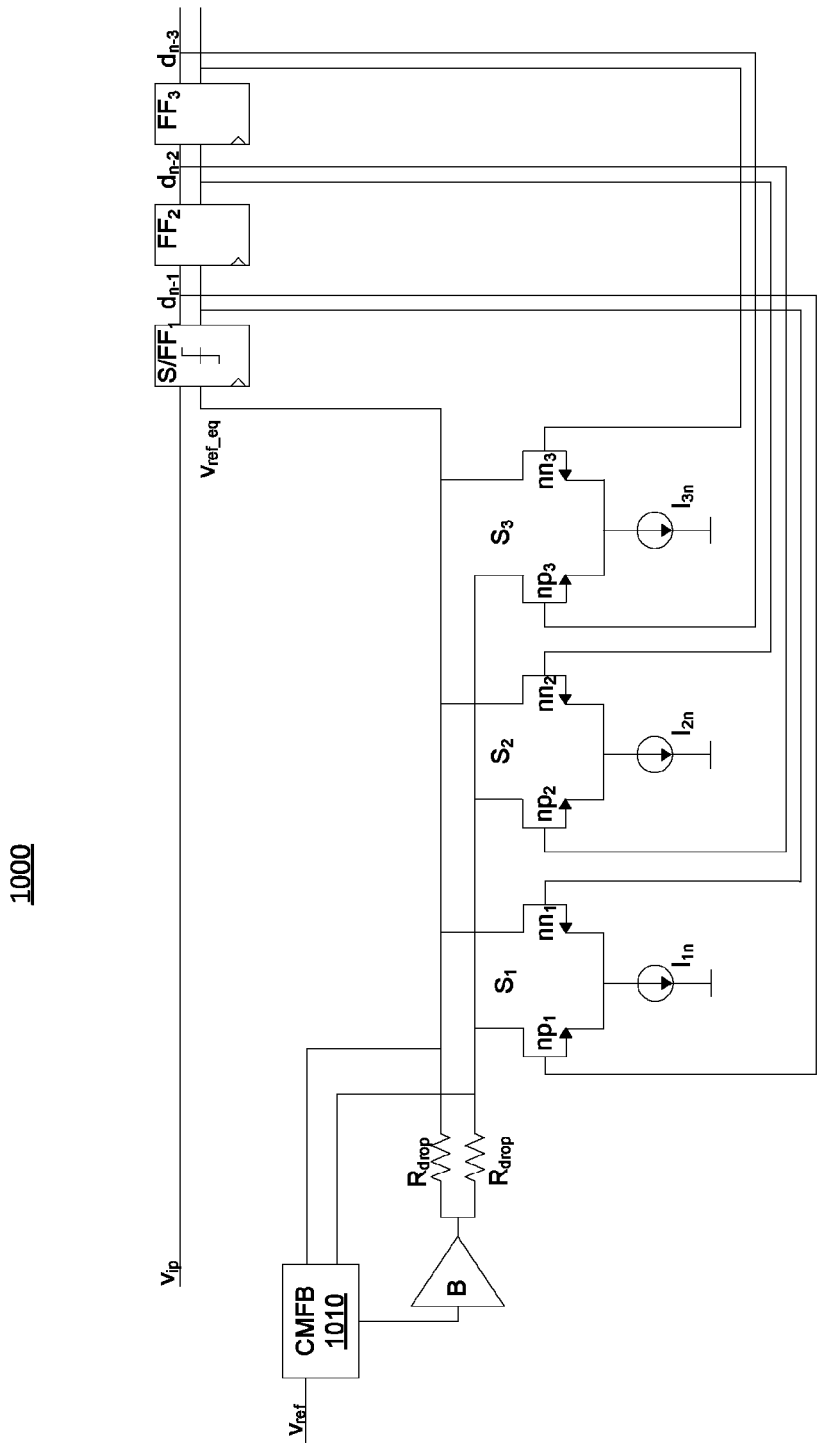
FIG. 10 is a simplified diagram illustrating DFE system 1000 with a NMOS differential pairs according to an embodiment of the present invention.

It is to be appreciated that other implementations of DFE systems are possible as well. For example, the current sources may be implemented only with NMOS differential pairs. FIG. 10 is a simplified diagram illustrating DFE system 1000 with a NMOS differential pairs according to an embodiment of the present invention. This diagram is merely an example, which should not unduly limit the scope of the claims. One of ordinary skill in the art would recognize many variations, alternatives, and modifications. As shown in FIG. 10, the DFE system 1000 uses only one type of current sources and differential pairs (NMOS). These current sources and differential pairs are used to commutate currents into two $R_{drop}$ resistors, one of which is connected to the $v_{ref\_eq}$ input of the sampler. The DFE system 1000 additionally includes a common-mode feedback (CMFB) module 1010 to ensure that the average value of $v_{ref\_eq}$ is substantially equal to $v_{ref}$. Without the CMFB module 1010, large offsets can be introduced which degrade receiver performance. Depending on the implementation, DFE system 1000 may include other components as well. For example, as explained above, different number n of switches and flip-flops may be used. For example, in FIGS. 8-10, n=3, as three flip-flops and three corresponding switches are provided. That means three decision levels for three post-cursor positions are stored and used during the equalization process. Depending on the implementation, n may be larger for a higher degree of accuracy, or smaller to reduce circuit complexity.

As an example, the DFE system 900 is implemented as a part of a receiver module. For example, the DFE system 900 is coupled to the receiver input terminal, and it removes ISI from the received signal before the signal is processed.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A DFE system comprising:
an input terminal for receiving an input voltage;
a reference terminal for receiving a reference voltage, the reference voltage being substantially independent from the input voltage;
a buffer module connected to the reference terminal via a buffer input, the buffer module being substantially isolated from the input terminal;
a first drop resistor coupled to the buffer module via a buffer output;
a shift register comprising n flip-flops for storing equalization decision levels; and
a switching module comprising n switches electrically coupled to the n flip-flops, the n switches including a first switch, the first switch comprising a pair of current sources, wherein the switching module is configured to provide equalization voltage by generating equalization currents using decision levels stored at the shift register to the first drop resistor.

2. The system of claim 1 wherein the decision levels are associated with post-cursor positions of a previous signal.

3. The system of claim 1 wherein each of then flip-flop corresponds to a decision feedback equalization tap.

4. The system of claim 1 wherein the pair of current sources are matched.

5. The system of claim 1 wherein the buffer module comprises one or more chopping amplifiers.

6. The system of claim 1 wherein the reference voltage is coupled to a DC path.

7. The system of claim 1 wherein each of the current sources comprises matching NMOS elements and PMOS elements.

8. The system of claim 1 wherein the pair of current sources are turned on when the equalization voltage is needed.

9. The system of claim 1 wherein the first switch comprises a pair of differential NMOS resistors and a pair of differential PMOS resistors.

10. The system of claim 1 further comprising a second drop resistor configured in parallel to the first drop resistor.

* * * * *